US006917194B2

(12) United States Patent
Fleischman et al.

(10) Patent No.: US 6,917,194 B2
(45) Date of Patent: Jul. 12, 2005

(54) EXTERNAL VERIFICATION OF PACKAGE PROCESSED LINEWIDTHS AND SPACINGS IN SEMICONDUCTOR PACKAGES

(75) Inventors: Thomas J. Fleischman, Poughkeepsie, NY (US); David C. Long, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,933

(22) Filed: Aug. 27, 2003

(65) Prior Publication Data

US 2005/0046410 A1 Mar. 3, 2005

(51) Int. Cl.[7] .............................................. G01R 31/02
(52) U.S. Cl. ..................... 324/158.1; 324/537; 324/538
(58) Field of Search ............................. 324/158.1, 537, 324/538

(56) References Cited

U.S. PATENT DOCUMENTS

| | | | | |
|---|---|---|---|---|
| 3,781,683 A | * | 12/1973 | Freed | 324/765 |
| 3,849,872 A | * | 11/1974 | Hubacher | 438/17 |
| 4,417,203 A | * | 11/1983 | Pfeiffer et al. | 324/501 |
| 4,467,400 A | * | 8/1984 | Stopper | 361/767 |
| 4,933,635 A | * | 6/1990 | Deutsch et al. | 324/766 |
| 5,059,899 A | * | 10/1991 | Farnworth et al. | 438/18 |
| 5,262,719 A | * | 11/1993 | Magdo | 324/158.1 |
| 5,276,963 A | | 1/1994 | Flanders | |

* cited by examiner

Primary Examiner—Ernest Karlsen
(74) Attorney, Agent, or Firm—McGinn & Gibb, PLLC; James J. Cioffi, Esq.

(57) ABSTRACT

Disclose is a method that forms non-functional test structures in kerf regions outside functional wiring modules of the ceramic greensheets and across edges of the functional wiring modules, and an associated structure. In order to check or test the spacing and size of wires in functional wiring modules, the invention only needs to examine the non-functional test structures as exposed by cutting the multi-module greensheet along the laminate trim line or by dicing of the greensheet into individual modules. The non-functional wires have the same design spacing, size, and angles as wires in the functional wiring modules. Therefore, the non-functional test structures comprise representative wires of wires in the functional wiring modules.

20 Claims, 6 Drawing Sheets

EXTERNAL VERIFICATION OF PACKAGE PROCESSED LINEWIDTHS AND SPACINGS IN SEMICONDUCTOR PACKAGES

BACKGROUND OF INVENTION

1. Field of the Invention

The present invention generally relates to testing of greensheets, and more particularly to an improved structure and test method that forms non-functional wires in kerf regions that can be tested in place of the functional wires in the greensheet.

2. Description of the Related Art

Conventionally, electrical measurements are used to determine the proper design and manufacturing of ceramic module wiring. These measurements occur near the end of the manufacturing process. Thus, design and/or manufacturing errors and defects are conventionally not found until late in the process. The invention described below provides a method and structure to measure the "as manufactured" line widths and spacings before or after package sectioning.

Circuit traces, or nets, in a multilayer ceramic substrate suffer increasing demand from circuit designers, application requirements and cost. Line widths and spacings are being made smaller and, in addition, net electrical requirements are getting tighter (i.e., lower resistance, electrical characteristic impedance, etc.). The typical process flow for manufacturing a multi-layer ceramic module (MLC) does have optical inspections after screening the circuit trace/net onto the layer, however this optical inspection tool only examines portions of the circuitry and can only measure the shape of the net, not the performance of the net.

Electrical testing of the net can occur only at the end of the manufacturing process and errors detected at the end of the manufacturing process result in scrap of the module since repair is not possible. This invention described below provides a methodology/structure where rapid analysis can be performed to identify the layer(s) with incorrect linewidths, line cross section, composition and/or spacings.

SUMMARY OF INVENTION

The invention provides a method of verifying wiring spacing and sizing in ceramic greensheets. The invention first forms non-functional test structures in kerf regions outside functional wiring modules of the ceramic greensheets and across edges of the functional wiring modules. Then, the invention divides the greensheets along the kerf regions. In order to verify or test the spacing and size of wires in functional wiring modules, the invention only needs to examine the non-functional test structures as exposed by cutting the multi-module greensheet along the laminate trim line or by dicing of the greensheet into individual modules. The non-functional wires have the same design spacing, size, and angles as wires in the functional wiring modules. Therefore, the non-functional test structures comprise representative wires equivalent to the wires in the functional wiring modules.

This method produces ceramic greensheets that have non-functional test structures located in kerf regions outside functional wiring modules and across edges of the functional wiring modules. Once again, these non-functional test structures have no functional purpose within the module except to indicate the spacing and size of other wires in the functional wiring modules and are used to verify that the greensheets are stacked in the proper order, orientation and are the correct part number.

BRIEF DESCRIPTION OF DRAWINGS

The invention will be better understood from the following detailed description with reference to the drawings, in which.

DETAILED DESCRIPTION

As mentioned above, the invention forms non-functional test structures in kerf regions outside functional wiring modules of the ceramic greensheets and across edges of the functional wiring modules. In order to verify or test the spacing and size of wires in functional wiring modules, the invention only needs to examine the non-functional test structures as exposed by cutting the multi-module greensheet along the laminate trim line or by dicing of the greensheet into individual modules. The non-functional wires have the same design spacing, size, and angles as wires in the functional wiring modules. Therefore, the non-functional test structures comprise representative wires of wires in the functional wiring modules. Thus, defects in the test structures will indicate that there are defects in the wires within the functional wiring modules.

Thus, the invention adds non-functional test structures to the mask to be screened onto the layer during screening. These test structures are placed to intersect the laminate trim line and in the 'kerf' areas through which the laminate is cut into the smaller substrates, and/or on the edge just between the kerf region and the functional areas. Each layer in the multi-layer greensheets is provided unique test structures that are based to reflect the requirements of that particular layer. Thus, the invention identifies any errors induced by design or screening for each layer based on separate testing requirements.

The invention provides a method for making non-intrusive measurements of manufactured line widths and spacings. The inventive methodology does not require changes to current design practices or manufacturing processes (except for the addition of the test structures and the testing (observation) processes). For each particular layer, the line widths, spacings, and wire orientations used in the actual circuitry of that layer form the basis for the test structures for that layer. Thus, each layer in the multi-layer ceramic structure will potentially include different test structures having different line widths, spacings, etc. For example, lines in the structure will be in the x direction, some in the y direction and some in each of the 45 degree angles allowed for diagonal wiring. In order to test line widths, spacings, etc. the invention polishes the side of the substrate and analyzes vias microscopically. Alternatively the test structures can be analyzed electrically, via probing.

Figure 1:
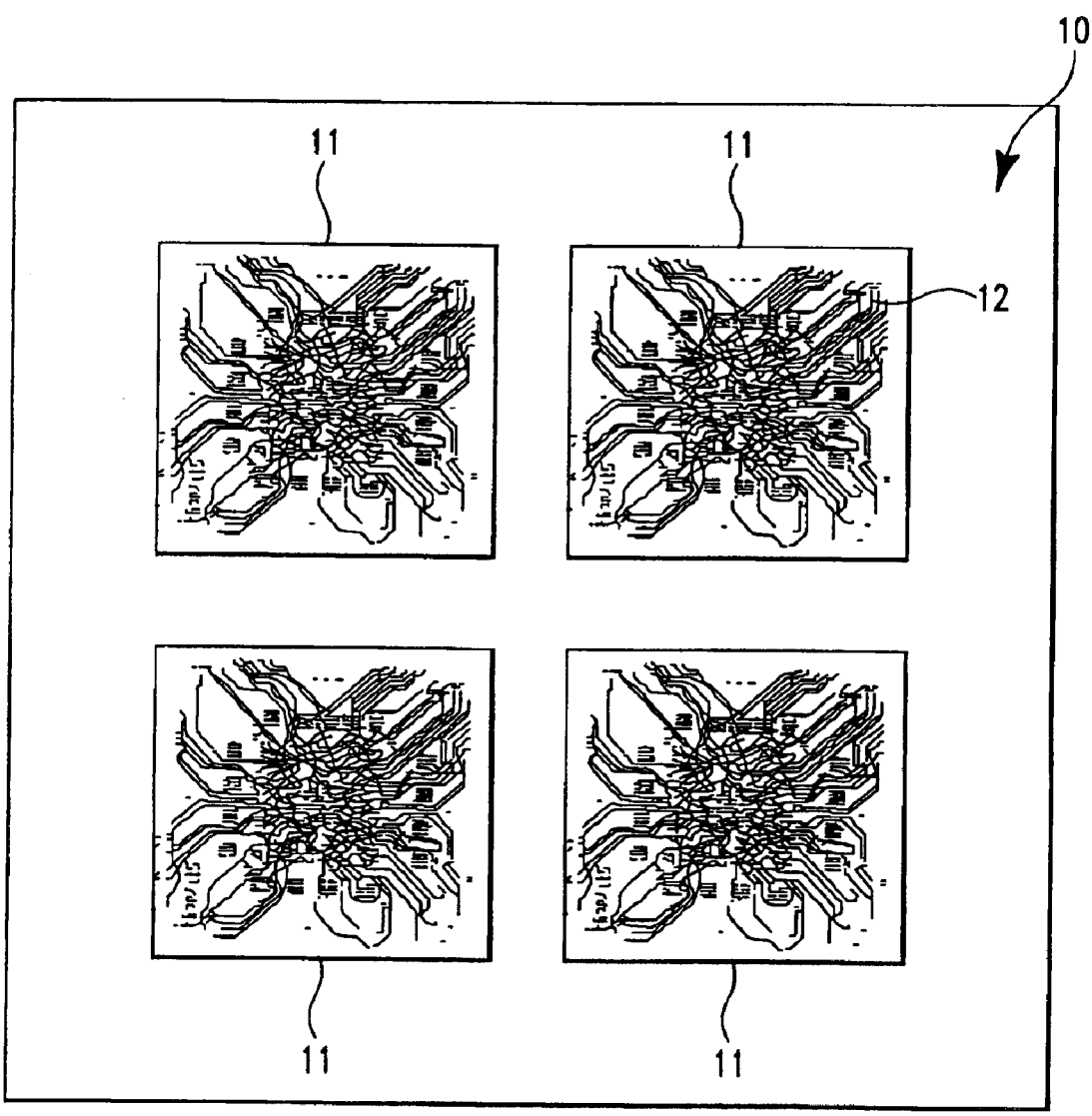
FIG. 1 is a schematic diagram of a multi-module greensheet.

FIG. 1 shows a typical 'greensheet' 10 with, but not limited to, a 4-up design which has four individual but exact replica substrates (modules) 11 screened onto this greensheet layer 10. Each of these sites 11 has wiring lines and vias 12 screened onto them. These lines are of specific widths and spacings, according to manufacturing and design requirements and capabilities.

Figure 2:
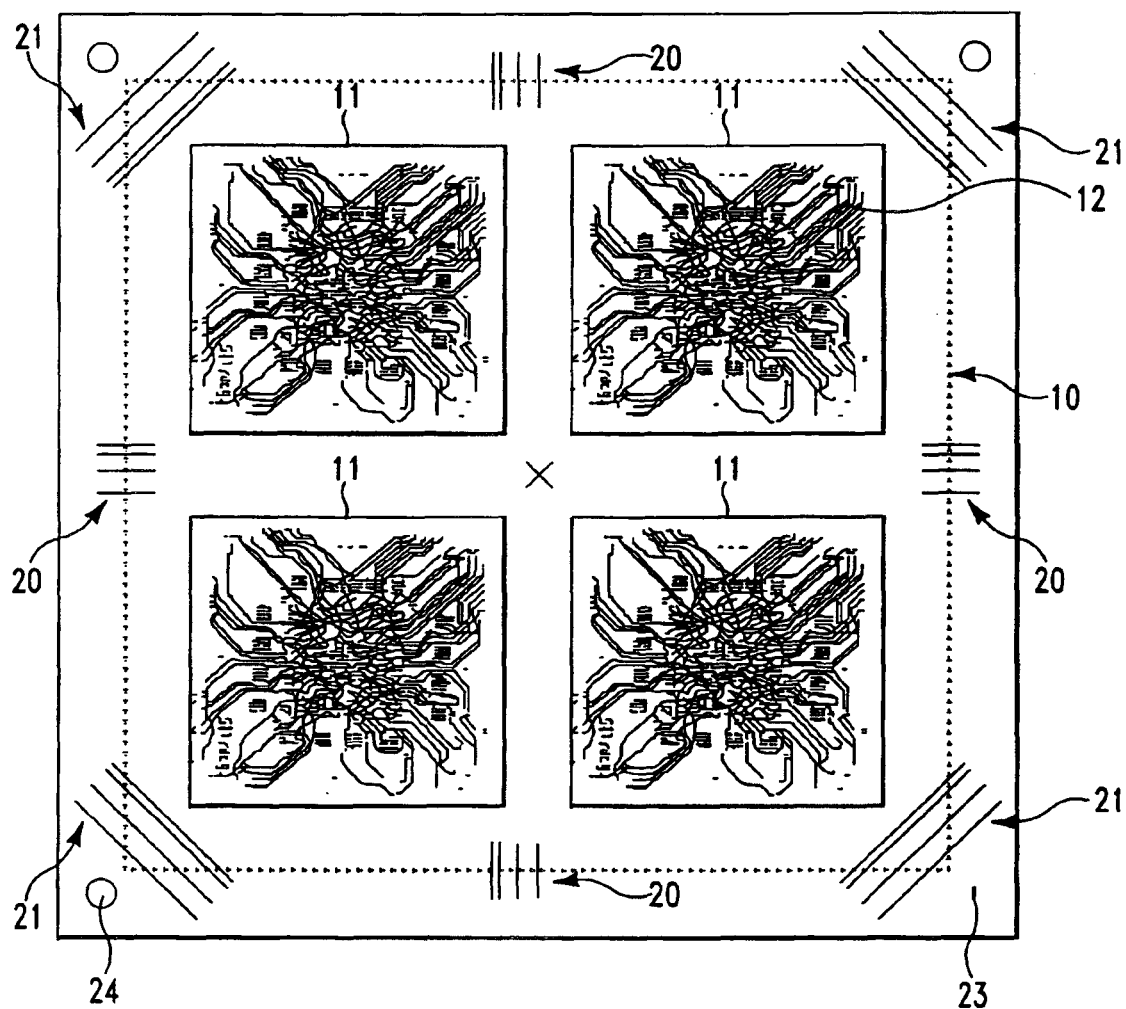
FIG. 2 is a schematic diagram of a multi-module greensheet with test structures.
Figure 3:
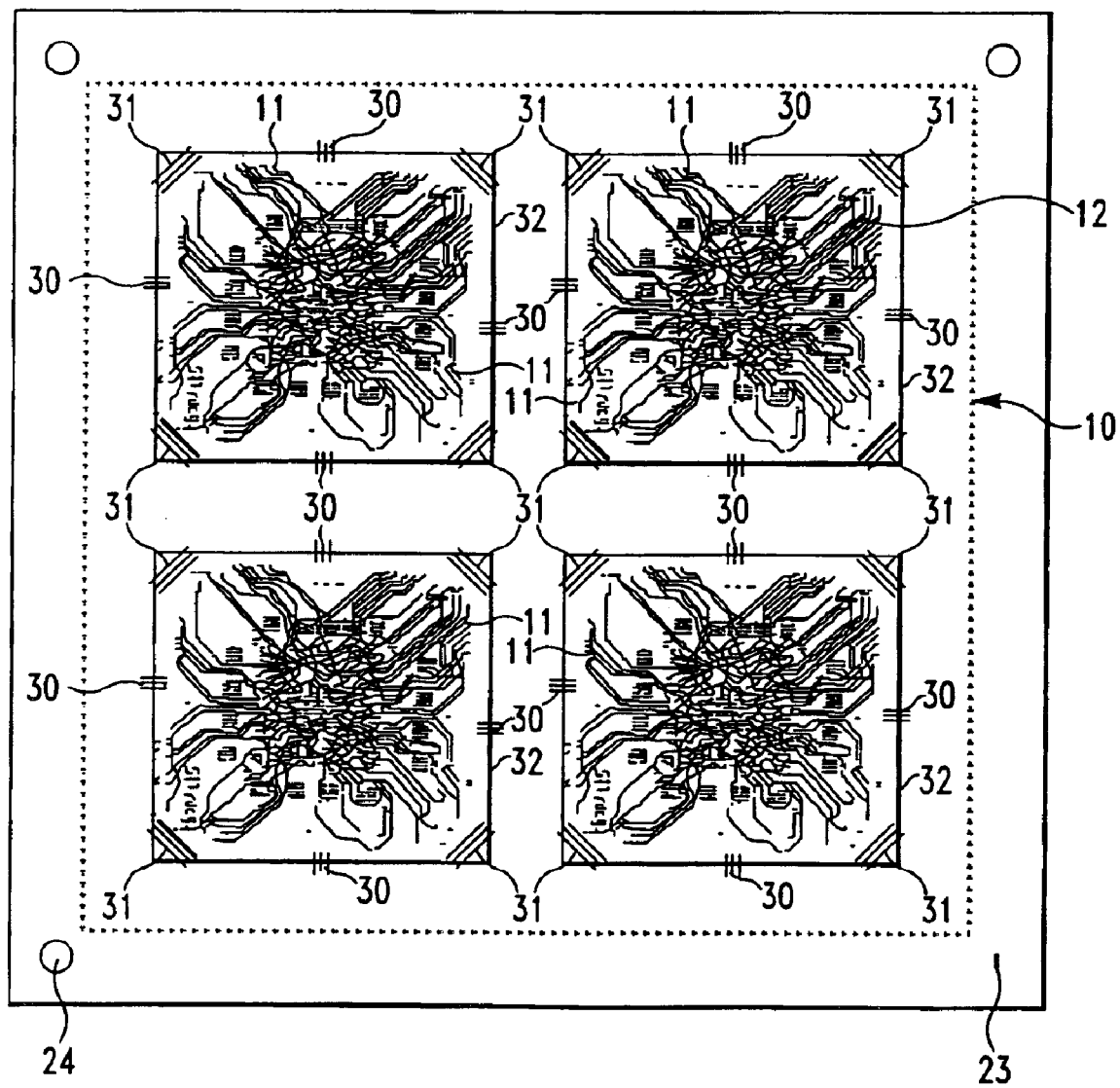
FIG. 3 is a schematic diagram of a multi-module greensheet with test structures.
Figure 4:
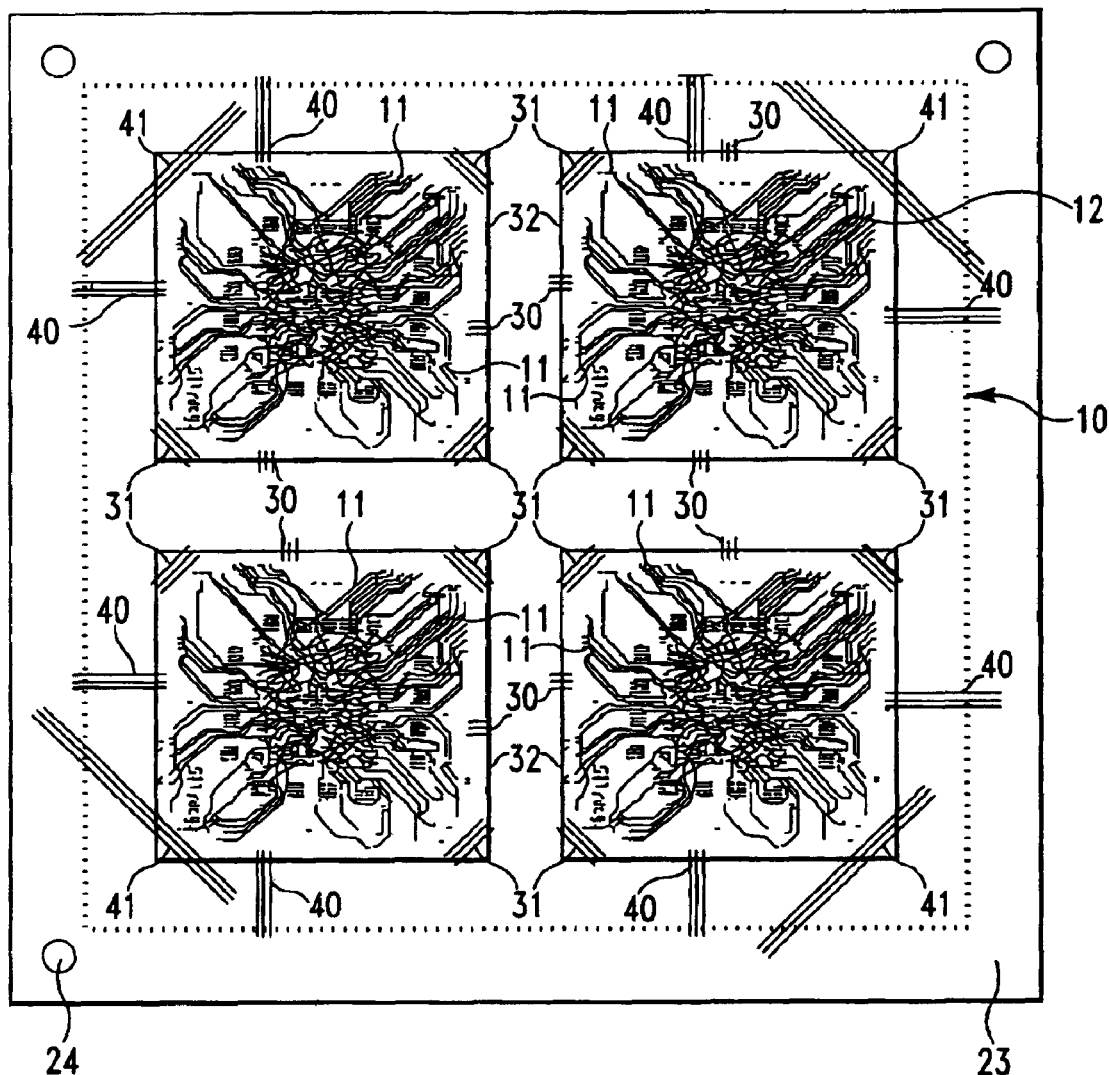
FIG. 4 is a schematic diagram of a multi-module greensheet with test structures.

FIG. 2 shows the placement of the test structures 20, 21 that intersect the laminate trim/cut line 23 along which the laminate is cut for initial trimming. Alignment holes are shown as item 24. Test structures 20 are horizontal or vertical to the wires in the individual substrate modules 11, while test structures 21 are set at a predetermined angle (such as 45 degrees) to simulate angled portions of wires in the individual modules 11. FIG. 3 shows the placement of similar horizontal/vertical and angled test structures 30, 31 across the edges of the modules 11 (in the kerf areas of the greensheet). These test structures 30, 31 will remain as part of the final structure of the substrate modules even after they are cut at final sizing. FIG. 4 shows an embodiment that includes test structures that cross the laminate trim line 23 (test structures 40, 41) and the final sizing line 32 (test structures 30, 31). Note that horizontal/vertical and angled test structures 40, 41 cross both the laminate trim line 23 and the final sizing line 32.

Figure 5:
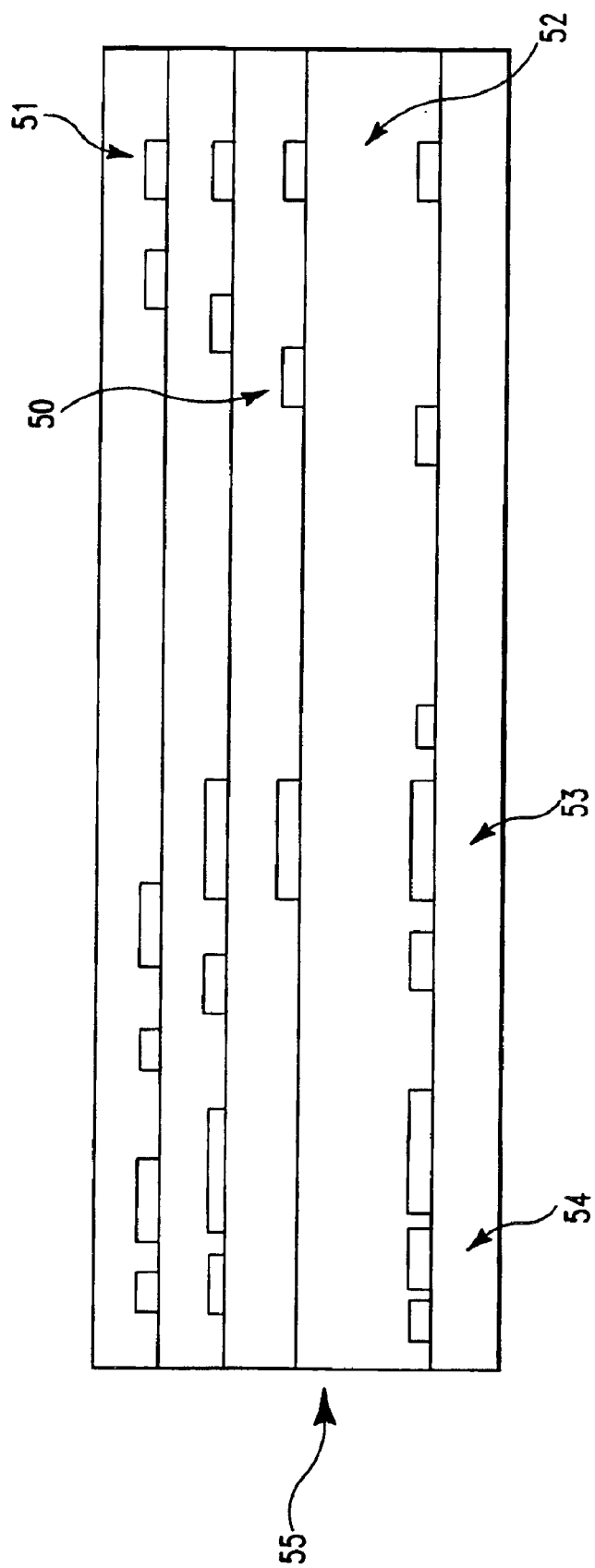
FIG. 5 is a cross-sectional schematic diagram a of a multi-layer greensheet showing exposed test structures.

FIG. 5 shows a sideview of the cut laminate or final module 55 that includes a number of wiring layers. FIG. 5 also shows the test structure lines 50–54 exposed and cut by laminate or final sizing. In all embodiments, to test the manufactured line widths and spacings all that is needed is to examine (observe visually) the side of the cut greensheet (FIG. 5) that is cut along the laminate trim line 23 or along the final sizing line 32. In addition to linewidths and spacings, one can also measure and verify layer thickness. Proper alignment can also be verified by placing a series of lines to be cut on each layer and visual verification of proper alignment 51 and stackup 50 (missing or incorrectly ordered layers). In addition, test structures 53, 54 are formed at maximum/minimum wire spacings of the wires within the modules 11 to allow such extremes to be easily tested. Additionally, microscopic and electrical inspection may also be used to verify that the correct metal paste was used on each layer.

Figure 6:
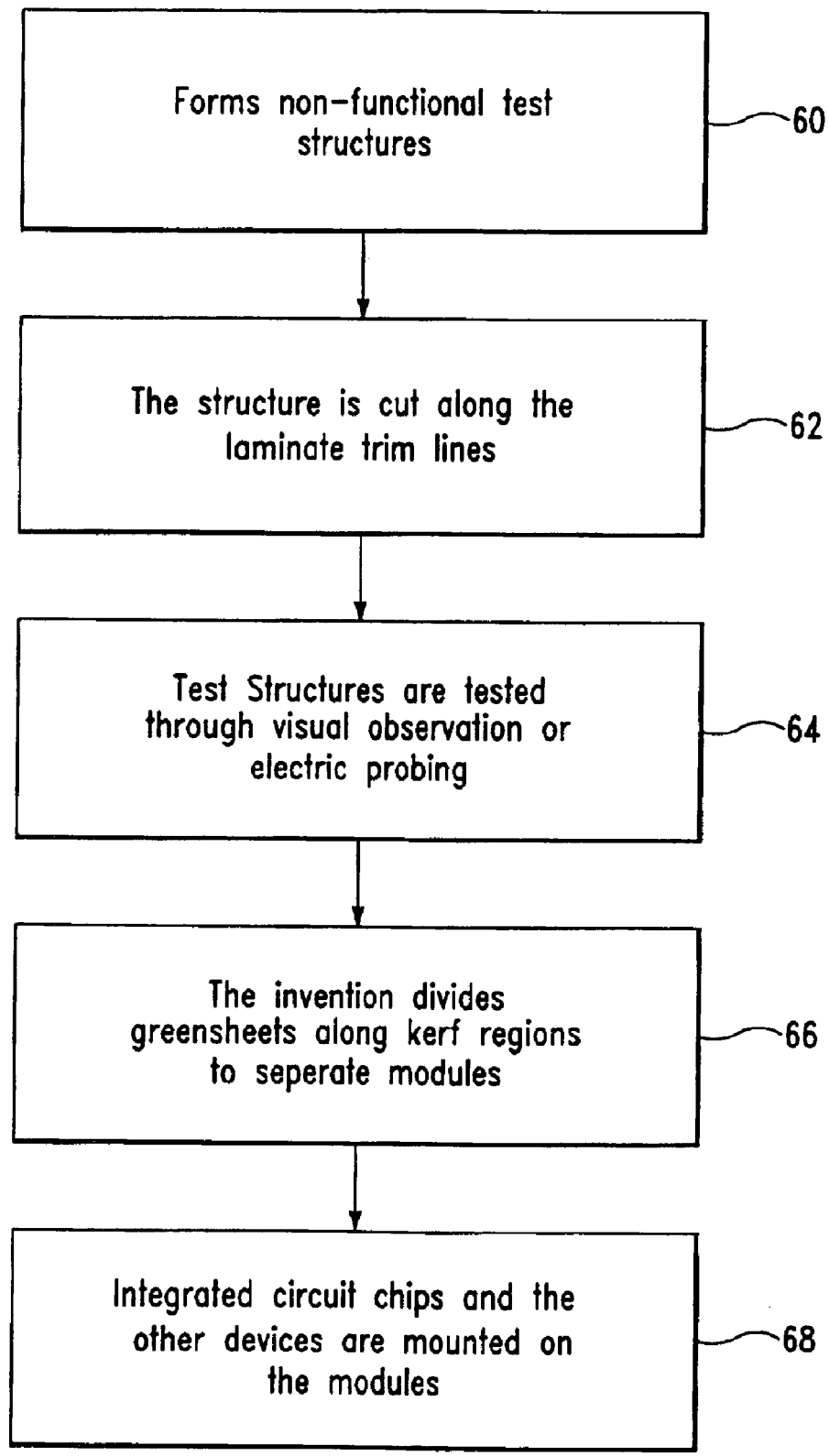
FIG. 6 is a flow diagram illustrating a preferred method of the invention.

As shown in the flowchart of FIG. 6, the invention provides a method of testing wiring spacing and sizing in ceramic greensheets. In item 60, the invention first forms non-functional test structures in kerf regions outside functional wiring modules of the ceramic greensheets and/or across edges of the functional wiring modules. Next, the structure is cut along the laminate trim line 23 in item 62. At this point, the test structures 20, 21, 40, 41 are exposed along the cross-sectional view of the structure (as shown in FIG. 5, above) and are tested through visual observation or electric probing in item 64. Thus, the invention allows the greensheets to be tested even before the individual modules are diced. Then, the invention divides the greensheets along the kerf regions in item 66 to separate the modules. Integrated circuit chips and the other devices are mounted on the modules 68. Because the test structures 30, 31, 40, 41 remain as part of the permanent ceramic substrate module, the completed structure (including the later attached chips, etc.) can be tested (electrically or visually) at the end of the manufacturing process, or even after the product has been in use in completed devices, as shown in item 70. Thus, the invention is even useful to quickly locate devices that are returned from customers as being defective because the test structures provide indications as to which types of errors may be present (spacing errors, line size errors, etc.) and indicates upon which level within the multi-level ceramic structure the errors may be present. In other words, the cross-sectional views of the test structures that indicate marginal line quality in a specific layer of the ceramic greensheets can help designers more quickly locate the defect by the indicating the layer which contains the defect. Therefore, the invention provides a test structure that can be observed/electrically tested at any point in the life cycle of the device. Thus, with the invention, the dice or undiced greensheets can be tested by simply observing the cross-section of the structure after trimming or dicing. The invention can be used to verify that the correct metal paste was used (some layers use paste with more or less glass and ceramic powder), to verify the proper stacking order of the layers, and/or to verify that the proper layer part number was used (by examining the cross section location, i.e. a recognized pattern, bar code, etc.).

The non-functional wires have the same design spacing, size, and angles as wires in the functional wiring modules. Therefore, the non-functional test structures comprise representative wires of wires in the functional wiring modules. This method produces ceramic greensheets that have non-functional test structures located in kerf regions outside functional wiring modules and across edges of the functional wiring modules. Once again, these non-functional test structures indicate the spacing and size of wires in the functional wiring modules.

In order to check or test the spacing and size of wires in functional wiring modules, the invention only needs to examine the non-functional test structures as exposed by cutting the multi-module greensheet along the laminate trim line or by dicing of the greensheet into individual modules. The non-functional wires have the same design spacing, size, and angles as wires in the functional wiring modules. Therefore, the non-functional test structures comprise representative wires of wires in the functional wiring modules.

While the invention has been described in terms of preferred embodiments, those skilled in the art will recognize that the invention can be practiced with modification within the spirit and scope of the appended claims.

What is claimed is:

1. A ceramic greensheet comprising:
    non-functional test structures located in regions outside functional wiring modules,
    wherein said non-functional test structures intersect trim/cut lines along which said ceramic greensheet will be divided such that said non-functional test structures remain as part of the final structure of said the ceramic greensheet after said ceramic greensheet is divided into final sizes, and
    wherein said non-functional test structures indicate the spacing and size of wires in said functional wiring modules.

2. The ceramic greensheet in claim 1, wherein said regions outside said functional wiring modules comprise regions that are removed as said greensheet is divided into said functional wiring modules.

3. The ceramic greensheet in claim 1, wherein said non-functional wires have the same design spacing, size, and angles as wires in said functional wiring modules.

4. The ceramic greensheet in claim 1, wherein said non-functional test structures comprise representative wires of wires in said functional wiring modules.

5. The ceramic greensheet in claim 1, wherein said functional wiring modules are surrounded by kerf regions, such that each of said functional wiring modules is adapted to be separated into an individual module when said greensheet is divided.

6. The ceramic greensheet in claim 1, wherein said non-functional test structures are exposed when said ceramic greensheet is divided into said final sizes.

7. The ceramic greensheet in claim 1, wherein said non-functional test structures intersect a final sizing line separate from said trim/cut lines.

8. A ceramic greensheet comprising:

non-functional test structures located in regions outside functional wiring modules, wherein said non-functional test structures intersect kerf regions along which said ceramic greensheet will be divided such that said non-functional test structures remain as part of the final structure of said the ceramic greensheet after said ceramic greensheet is divided into final sizes, and wherein said non-functional test structures indicate the spacing and size of wires in said functional wiring modules.

9. The ceramic greensheet in claim 8, wherein said regions outside said functional wiring modules comprise regions that are removed as said greensheet is divided into said functional wiring modules.

10. The ceramic greensheet in claim 8, wherein said non-functional wires have the same design spacing, size, and angles as wires in said functional wiring modules.

11. The ceramic greensheet in claim 8, wherein said non-functional test structures comprise representative wires of wires in said functional wiring modules.

12. The ceramic greensheet in claim 8, wherein said functional wiring modules are surrounded by said kerf regions, such that each of said functional wiring modules is adapted to be separated into an individual module when said greensheet is divided.

13. The ceramic greensheet in claim 8, wherein said non-functional test structures are exposed when said ceramic greensheet is divided into said final sizes.

14. The ceramic greensheet in claim 8, wherein said non-functional test structures intersect a final sizing line separate from said kerf regions.

15. A ceramic greensheet comprising:

non-functional test structures located in regions outside functional wiring modules, wherein said non-functional test structures intersect kerf regions along which said ceramic greensheet will be divided, and intersect final sizing lines separate from said kerf regions, such that said non-functional test structures remain as part of the final structure of said the ceramic greensheet after said ceramic greensheet is divided into final sizes, and wherein said non-functional test structures indicate the spacing and size of wires in said functional wiring modules.

16. The ceramic greensheet in claim 15, wherein said regions outside said functional wiring modules comprise regions that are removed as said greensheet is divided into said functional wiring modules.

17. The ceramic greensheet in claim 15, wherein said non-functional wires have the same design spacing, size, and angles as wires in said functional wiring modules.

18. The ceramic greensheet in claim 15, wherein said non-functional test structures comprise representative wires of wires in said functional wiring modules.

19. The ceramic greensheet in claim 15, wherein said functional wiring modules are surrounded by said kerf regions, such that each of said functional wiring modules is adapted to be separated into an individual module when said greensheet is divided.

20. The ceramic greensheet in claim 15, wherein said non-functional test structures are exposed when said ceramic greensheet is divided into said final sizes.

* * * * *